US012764968B2

(12) United States Patent
Lee et al.

(10) Patent No.: US 12,764,968 B2
(45) Date of Patent: Oct. 13, 2026

(54) SEMICONDUCTOR DEVICE WITH A GATE INSULATING LAYER HAVING INCREASED Al—O BOND ENERGY, A DIFFUSION-SUPRESSING INTERFACE LAYER BETWEEN A GATE INSULATING LAYER AND A CHANNEL STRUCTURE, AND CAPACITOR STRUCTURES ON CHANNEL STRUCTURES

(71) Applicants: SAMSUNG ELECTRONICS CO., LTD., Suwon-si (KR); IUCF-HYU (INDUSTRY-UNIVERSITY COOPERATION FOUNDATION HANYANG UNIVERSITY), Seoul (KR)

(72) Inventors: Seunghee Lee, Suwon-si (KR); Jin-Seong Park, Seoul (KR); Jihyun Kho, Suwon-si (KR); Dong-Gyu Kim, Seoul (KR); Yurim Kim, Suwon-si (KR); Yong-Suk Tak, Suwon-si (KR)

(73) Assignees: SAMSUNG ELECTRONICS CO., LTD., Suwon-si (KR); IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 353 days.

(21) Appl. No.: 18/436,574

(22) Filed: Feb. 8, 2024

(65) Prior Publication Data

US 2024/0414925 A1 Dec. 12, 2024

(30) Foreign Application Priority Data

Jun. 7, 2023 (KR) ........................ 10-2023-0072772

(51) Int. Cl.
*H10B 53/20* (2023.01)
*H10B 51/10* (2023.01)
(Continued)

(52) U.S. Cl.
CPC ............. *H10B 53/20* (2023.02); *H10B 51/10* (2023.02); *H10B 51/20* (2023.02); *H10B 53/10* (2023.02);
(Continued)

(58) Field of Classification Search
CPC ........ H10B 53/20; H10B 51/10; H10B 51/20; H10B 53/10; H10B 12/05; H10B 12/30;
(Continued)

(56) References Cited

U.S. PATENT DOCUMENTS 9,312,279 B2 4/2016 Cha et al.
9,653,613 B2 5/2017 Yamazaki et al.
(Continued)

FOREIGN PATENT DOCUMENTS

JP 7204353 B2 1/2023
JP 2023-29986 A 3/2023
(Continued)

OTHER PUBLICATIONS

Batra et al., Influence of Deposition Temperature of Thermal ALD Deposited Al2O3 Films on Silicon Surface Passivation, AIP Advances, Jun. 5, 2015, pp. 067113-1 through 067113-10, vol. 5, AIP Advances (Year: 2015).*
(Continued)

*Primary Examiner* — William B Partridge
*Assistant Examiner* — Erik A. Anderson
(74) *Attorney, Agent, or Firm* — Sughrue Mion, PLLC

(57) ABSTRACT

A semiconductor device has, in a gate insulating layer, in an XPS spectrum of O 1s obtained by an X-ray photoelectron spectroscopy (XPS) using a monochromatic aluminum Kα
(Continued)

(1486.6 eV) source, a ratio (%) of an Al—O peak observed in a binding energy of about 530.3 eV to about 531.6 eV to all peaks of greater than or equal to about 80%.

17 Claims, 10 Drawing Sheets

(51) Int. Cl.

| | |
|---|---|
| ***H10B 51/20*** | (2023.01) |
| ***H10B 53/10*** | (2023.01) |
| ***H10D 30/01*** | (2025.01) |
| ***H10D 30/69*** | (2025.01) |
| ***H10D 64/01*** | (2025.01) |
| ***H10D 64/68*** | (2025.01) |
| ***H10W 20/41*** | (2026.01) |

(52) U.S. Cl.

CPC ....... *H10D 30/0415* (2025.01); *H10D 30/701* (2025.01); *H10D 64/033* (2025.01); *H10D 64/689* (2025.01); *H10W 20/435* (2026.01)

(58) Field of Classification Search

CPC ................ H10B 12/315; H10B 12/482; H10D 30/0415; H10D 30/701; H10D 64/033; H10D 64/689; H10D 30/025; H10D 30/63; H10D 64/68; H10W 20/435; G01N 23/2273; G01N 2223/085

See application file for complete search history.

(56) References Cited

U.S. PATENT DOCUMENTS

| | | | | |
|---|---|---|---|---|
| 11,127,590 B2 | 9/2021 | Kwak et al. | |
| 2015/0069378 A1 | 3/2015 | Cha et al. | |
| 2016/0254386 A1 | 9/2016 | Yamazaki et al. | |
| 2020/0111917 A1* | 4/2020 | Ramaswamy | H10D 30/6728 |
| 2022/0122980 A1* | 4/2022 | Han | H10B 12/0335 |

FOREIGN PATENT DOCUMENTS

| | | |
|---|---|---|
| KR | 10-2075530 B1 | 2/2020 |
| KR | 10-2386990 B1 | 4/2022 |
| WO | 2022/038453 A1 | 2/2022 |

OTHER PUBLICATIONS

Batra et al., "Influence of deposition temperature of thermal ALD deposited $Al_2O_3$ films on silicon surface passivation," AIP Advances, vol. 5, No. 067113, 2015, Total 11 pages.

Kim et al., "Influence of growth temperature on dielectric strength of $Al_2O_3$ thin films prepared via atomic layer deposition at low temperature," Scientific Reports, vol. 12, No. 5124, 2022, Total 6 pages.

Guerra-Nuñez et al., "Reaction and Growth Mechanisms in $Al_2O_3$ deposited via Atomic Layer Deposition: Elucidating the Hydrogen Source," Chem. Mater., vol. 29, pp. 8690-8703, 2017.

Jin et al., "Strategic Selection of the Oxygen Source for Low Temperature-Atomic Layer Deposition of $Al_2O_3$ Thin Film," Advanced Electronic Materials, vol. 5, No. 1800680, 2019, Total 8 pages.

Elliott et al., "Ozone-Based Atomic Layer Deposition of Alumina from TMA: Growth, Morphology, and Reaction Mechanism," Chem. Mater., vol. 18, No. 16, pp. 3764-3773, 2006.

Goldstein et al., "$Al_2O_3$ Atomic Layer Deposition with Trimethylaluminum and Ozone Studied by in Situ Transmission FTIR Spectroscopy and Quadrupole Mass Spectrometry," J. Phys. Chem. C, vol. 112, No. 49, pp. 19530-19539, 2008.

Park et al., "Effects of Hydroxyl Group in $AlO_x$ Gate Insulator on the Negative Bias Illumination Instability of In—Ga—Zn—O Thin Film Transistors," Phys. Status Solidi A , 2019, Total 6 pages.

Hanyu et al., "Effects of High-Temperature Annealing on Operation Characteristics of a-In—Ga—Zn—O TFTs," Journal of Display Technology, vol. 10, No. 11, pp. 979-983, Nov. 2014.

Shiah et al., "Mobility—stability trade-off in oxide thin-film transistors," Nature Electronics, vol. 4, pp. 800-807, Nov. 2021.

Cho et al., "Remarkably stable high mobility self-aligned oxide TFT by investigating the effect of oxygen plasma time during Peald of $SiO_2$ gate insulator," Journal of Alloys and Compounds, vol. 893, No. 162308, 2022, Total 9 pages.

Choi et al., "High-Performance Indium Gallium Tin Oxide Transistors with an $Al_2O_3$ Gate Insulator Deposited by Atomic Layer Deposition at a Low Temperature of 150° C : Roles of Hydrogen and Excess Oxygen in the $Al_2O_3$ Dielectric Film," ACS Appl. Mater. Interfaces, vol. 13, pp. 28451-28461, 2021.

Jeong et al., "Impact of Annealing Temperature on Atomic Layer Deposited In—Ga—Zn—O Thin-Film Transistors," ACS Appl. Electron. Mater., vol. 4, pp. 1343-1350, 2022.

* cited by examiner

SEMICONDUCTOR DEVICE WITH A GATE INSULATING LAYER HAVING INCREASED Al—O BOND ENERGY, A DIFFUSION-SUPRESSING INTERFACE LAYER BETWEEN A GATE INSULATING LAYER AND A CHANNEL STRUCTURE, AND CAPACITOR STRUCTURES ON CHANNEL STRUCTURES

CROSS-REFERENCE TO RELATED APPLICATION

This application claims priority to Korean Patent Application No. 10-2023-0072772 filed in the Korean Intellectual Property Office on Jun. 7, 2023, the entire contents of which are incorporated herein by reference.

BACKGROUND

1. Field

The present disclosure relates to a semiconductor device and a method of manufacturing the same.

2. Description of the Related Art

In order to meet customer demand for excellent performance and a low price of a semiconductor memory device, it is required to increase integration of the semiconductor memory device. Since the integration of the semiconductor memory device is an important factor determining the price of products, it is particularly required to increase the integration.

Integration of a two-dimensional or planar semiconductor memory device is mainly determined by an area occupied by a unit memory cell, which is influenced by a technological level of forming a fine pattern. However, since the fine pattern requires highly expensive equipment, the integration of the two-dimensional semiconductor memory device is increasing but still limited. Accordingly, a semiconductor memory device including a vertical channel transistor having a channel extended in a vertical direction has been proposed.

SUMMARY

One aspect of the present disclosure provides a semiconductor device which suppresses the formation of oxygen-related deficiencies in a channel structure, increases Al—O bonds in a gate insulating layer, reduces C-related impurities, increases thin film density, and suppresses diffusion of Al and Zn to the interface between the gate insulating layer and the channel structure during high-temperature heat treatment to improve electrical characteristics and to secure excellent reliability, and a method for manufacturing the same.

A semiconductor device according to an aspect includes a substrate; first conductive lines disposed on the substrate, spaced apart from each other in a first direction, and extending in a second direction; channel structures disposed on the first conductive lines, spaced apart from each other in the first and second directions, and extending in a third direction crossing the first and second directions; gate electrodes disposed between the channel structures and extending in a first direction; a gate insulating layer disposed between a channel structure of the channel structures and a gate electrode of the gate electrodes; and capacitor structures disposed on the channel structures, wherein the gate insulating layer has a ratio (%) of an Al—O peak observed at a binding energy of about 530.3 eV to about 531.6 eV to all peaks of greater than or equal to about 80% in an XPS spectrum of O 1s obtained by an X-ray photoelectron spectroscopy (XPS) using a monochromatic aluminum Kα (1486.6 eV) source. The term "about" as used herein means that the value can vary by ±5%.

A semiconductor device according to another aspect includes a substrate; first conductive lines disposed on the substrate, spaced apart from each other in a first direction, and extending in a second direction; channel structures disposed on the first conductive lines, spaced apart from each other in the first and second directions, and extending in a third direction crossing the first and second directions; gate electrodes disposed between the channel structures and extending in a first direction; a gate insulating layer disposed between a channel structure of the channel structures and a gate electrode of the gate electrodes; an interface layer disposed between the gate insulating layer and the channel structure and including aluminum (Al), zinc (Zn), gallium (Ga), indium (In), or a combination thereof; and capacitor structures disposed on the channel structures.

According to another aspect, a method of manufacturing a semiconductor device includes forming first conductive lines spaced apart from each other in a first direction and extending in a second direction on a substrate; forming channel structures on the first conductive lines, spaced apart from each other in the first and second directions, and extending in a third direction crossing the first and second directions; forming a gate insulating layer surrounding sidewalls of a channel structure of the channel structures; forming gate electrodes extending in a first direction between the channel structures; and forming capacitor structures on the channel structures, wherein the gate insulating layer is formed at a deposition temperature of greater than or equal to about 300° C., and the channel structure and the gate insulating layer are heat-treated at a temperature of greater than or equal to about 500° C. in a subsequent process.

According to example embodiments, the semiconductor device and the method of manufacturing the same may suppress the formation of oxygen-related deficiencies in a channel structure, increase Al—O bonds in a gate insulating layer, reduce C-related impurities, increase thin film density, and suppress diffusion of Al and Zn to the interface between the gate insulating layer and the channel structure during high-temperature heat treatment to improve electrical characteristics and to secure excellent reliability.

DETAILED DESCRIPTION

Figure 1:
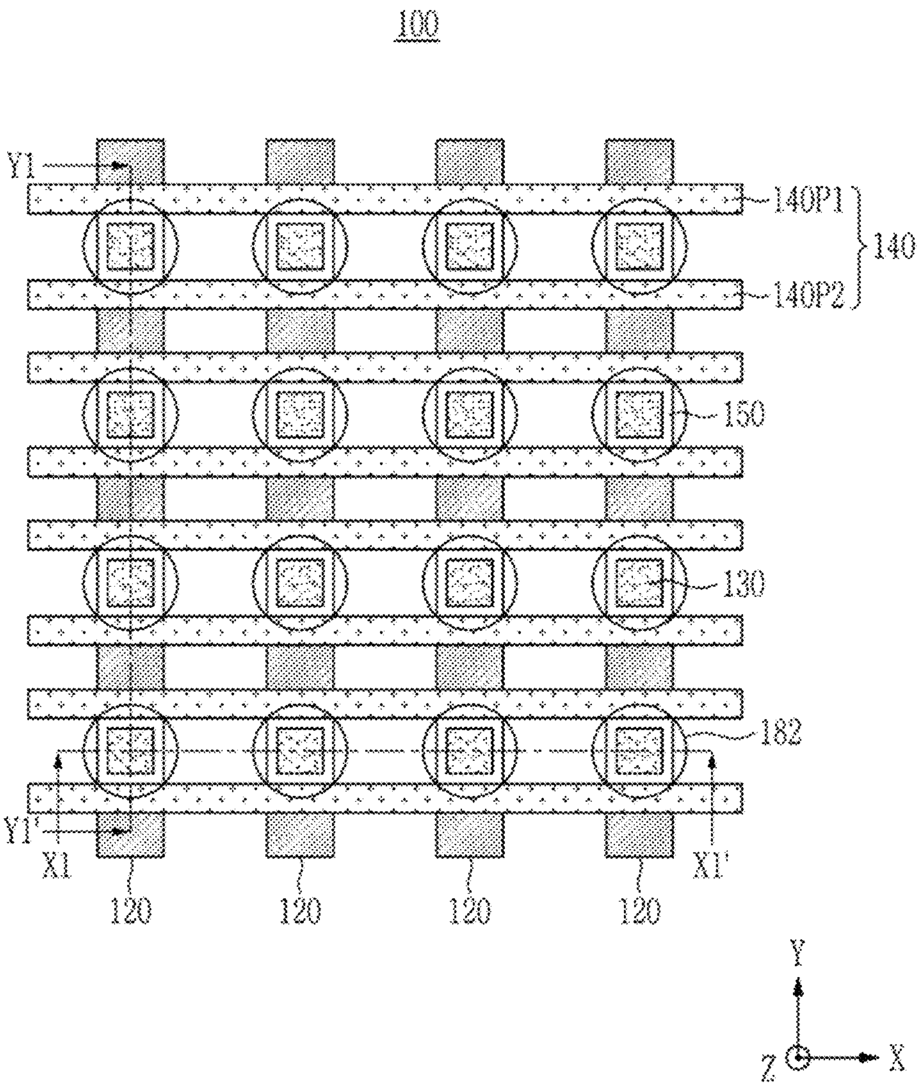
FIG. 1 is a layout diagram illustrating a semiconductor device according to an embodiment.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

The size and thickness of each constituent element as shown in the drawings are randomly indicated for better understanding and ease of description, and this disclosure is not necessarily limited to as shown. In the drawings, the thickness of layers, regions, etc., are exaggerated for clarity. In addition, in the drawings, for better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means being disposed on or below the object portion, and does not necessarily mean being disposed on the upper side of the object portion based on a gravitational direction.

In addition, unless explicitly described to the contrary, the word "comprise," and variations such as "comprises" or "comprising," will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

A semiconductor device 100 according to an embodiment will be described with reference to FIGS. 1 to 3.

Figure 2:
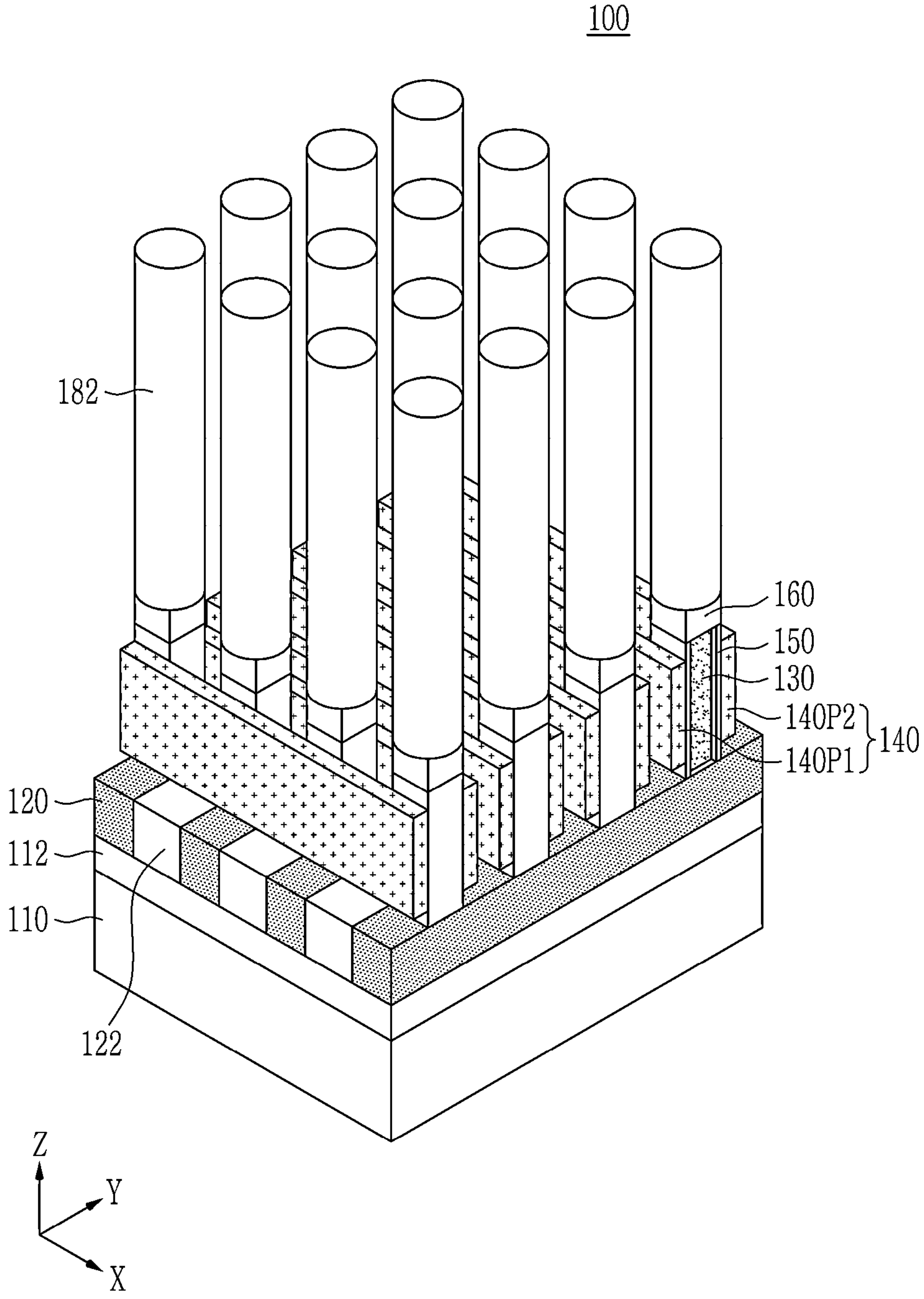
FIG. 2 is a perspective view illustrating the semiconductor device of FIG. 1.
Figure 3:
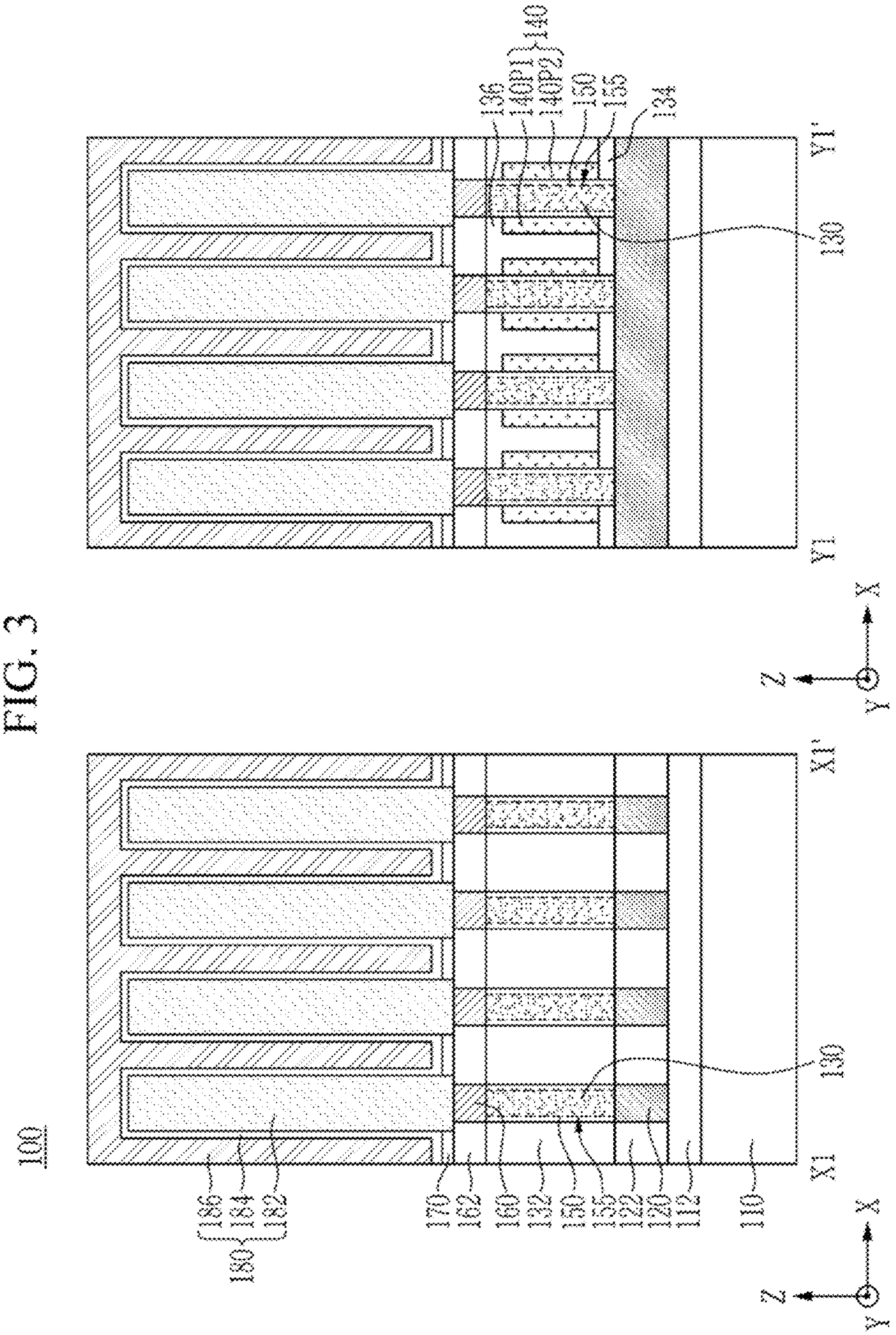
FIG. 3 is a cross-sectional view taken along lines X1-X1' and Y1-Y1' of FIG. 1.

FIG. 1 is a layout diagram illustrating a semiconductor device 100 according to an embodiment, FIG. 2 is a perspective view illustrating the semiconductor device of FIG. 1, and FIG. 3 is a cross-sectional view taken along lines X1-X1' and Y1-Y1' of FIG. 1.

Referring to FIGS. 1 to 3, the semiconductor device 100 includes a substrate 110, first conductive lines 120, channel structures 130, gate electrodes 140, a gate insulating layer 150, and capacitor structures 180. For example, the semiconductor device 100 may be a memory device including a vertical channel transistor (VCT). The vertical channel transistor may refer to a structure in which the channel length of the channel structures 130 extends from the substrate 110 in a vertical direction.

A lower insulating layer 112 may be disposed on the substrate 110, and on the lower insulating layer 112, the first conductive lines 120 may be spaced apart from each other in a first direction (X direction) and may extend in a second direction (Y direction). A first insulating pattern 122 may be disposed on the lower insulating layer 112 to fill a space between the first conductive lines 120. The first insulating pattern 122 may extend in the second direction (Y direction), and an upper surface of the first insulating pattern 122 may be disposed at the same level as an upper surface of the first conductive line 120. The first conductive lines 120 may function as bit lines of the semiconductor device 100.

For example, the first conductive lines 120 may include doped polysilicon, metal, conductive metal nitride, conductive metal silicide, conductive metal oxide, or a combination thereof. For example, the first conductive lines 120 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto. The first conductive lines 120 may include a single layer or multiple layers of the aforementioned materials.

For example, the first conductive lines 120 may include a 2D semiconductor material, and for example, the 2D semiconductor material may include graphene, carbon nanotubes, or a combination thereof.

The channel structures 130 may be arranged in an island shape spaced apart from each other in the first direction (X direction) and the second direction (Y direction) on the first conductive lines 120. The channel structures 130 may extend in a third direction (Z direction) perpendicular to the first direction (X direction) and the second direction (Y direction). The channel structures 130 may have a first width along a first direction (X direction) and a first height along a third direction (Z direction), and the first height may be greater than the first width. For example, the first height may be about 2 to about 10 times the first width, but is not limited thereto.

Bottom portions of the channel structures 130 may function as a first source/drain region (not shown), upper portions of the channel structures 130 may function as a second source/drain region (not shown), and portions of the channel structures 130 between the first source/drain and the second source/drain regions may function as a channel region (not shown).

For example, the channel structures 130 may include an oxide semiconductor, and the oxide semiconductor may include, for example, IGZO (indium gallium zinc oxide), IGSO (indium gallium silicon oxide), ITZO (indium tin zinc oxide), IGTO (indium gallium tin oxide), IZO (indium zinc oxide), ZnO (zinc oxide), ZTO (zinc tin oxide), ZnON (zinc oxynitride), ZZTO (zirconium zinc tin oxide), SnO (tin oxide), HIZO (hafnium indium zinc oxide), GZTO (gallium zinc tin oxide), AZTO (aluminium zinc tin oxide), YGZO (ytterbium gallium zinc oxide), IGO (indium gallium oxide), or a combination thereof. The channel structures 130 may include a single layer or multiple layers of oxide semiconductors.

For example, the channel structures 130 may have a bandgap energy greater than that of silicon. For example, the channel structures 130 may have a bandgap energy of about 1.5 eV to about 5.6 eV. For example, the channel structures 130 may have optimal channel performance when they have a bandgap energy of about 2.0 eV to about 4.0 eV. For example, the channel structures 130 may be polycrystalline or amorphous, but are not limited thereto. In addition, the channel structures 130 may include a 2D semiconductor material, and for example, the 2D semiconductor material may include graphene, carbon nanotubes, or a combination thereof.

The gate electrodes 140 may extend along both sidewalls of the channel structures 130 in a first direction (X direction). The gate electrodes 140 may include first sub-gate electrodes 140P1 facing the first sidewalls of the channel structures 130 and second sub-gate electrodes 140P2 facing a second sidewall disposed opposite the first sidewall of the channel structures 130. As one channel structure 130 is disposed between the first sub-gate electrode 140P1 and the second sub-gate electrode 140P2, the semiconductor device 100 may have a dual-gate transistor structure. However, the present disclosure is not limited thereto, and a single gate transistor structure may be implemented by omitting the second sub-gate electrode 140P2 and forming the first sub-gate electrode 140P1 alone facing the first sidewall of the channel structures 130.

The gate electrodes 140 may include doped polysilicon, metal, conductive metal nitride, conductive metal silicide, conductive metal oxide, or a combination thereof. For example, the gate electrodes 140 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but are not limited thereto.

The gate insulating layer 150 may surround sidewalls of the channel structures 130 and may be disposed between the channel structures 130 and the gate electrodes 140. For example, entire sidewalls of the channel structures 130 may be surrounded by the gate insulating layer 150, and portions of the sidewalls of the gate electrodes 140 may contact the gate insulating layer 150. As another example, the gate insulating layer 150 may extend in the extension direction of the gate electrodes 140 (i.e., the first direction (X direction)), and among the sidewalls of the channel structures 130, only two sidewalls facing the gate electrodes 140 may contact the gate insulating layer 150.

For example, the gate insulating layer 150 may include a silicon oxide layer, a silicon oxynitride layer, a high dielectric layer having a higher dielectric constant than the silicon oxide layer, or a combination thereof. The high dielectric layer may be made of metal oxide or metal oxynitride. For example, the high dielectric layer usable as the gate insulating layer 150 may include $HfO_2$, HfSiO, HfSiON, HfTaO, HfTiO, HfZrO, $ZrO_2$, $Al_2O_3$, or a combination thereof.

Meanwhile, although a relatively low process temperature (e.g., 200° C. or less) is required to form the channel structures 130 and the gate insulating layer 150, in a front end of line (FEOL) process for manufacturing the semiconductor device 100, a high process temperature of greater than or equal to about 500° C. or greater than or equal to about 600° C. is required.

However, electrical characteristics and reliability of the channel structure 130 and the gate insulating layer 150 may be deteriorated during high-temperature heat treatment (greater than or equal to about 400° C.).

Although not intending to be bound by a particular theory, this is due to formation of deficiencies caused by desorption of oxygen and hydrogen from the channel structure 130 and deterioration of the interface between the gate insulating layer 150 and the channel structure 130. For example, when the gate insulating layer 150 is formed at 200° C. using an atomic layer deposition (ALD) method and then subjected to high-temperature heat treatment at 600° C., oxygen-related deficiencies in the channel structure 130 may increase significantly, and $CH_3$ in the gate insulating layer 150 may not change in C content during heat treatment, but H may be desorbed and CO content may increase. An increase in oxygen-related deficiencies in the channel structure 130 may chemically separate oxygen in the channel structure 130 connected to the gate insulating layer 150 to form CO in the gate insulating layer 150. Accordingly, the switching characteristics of the semiconductor device 100 are well implemented, but reliability at a high temperature may be greatly deteriorated.

In a method of manufacturing the semiconductor device 100 according to an embodiment described later, the gate insulating layer 150 is formed at a deposition temperature of greater than or equal to about 300° C. or greater than or equal to about 400° C., so that even when heat treatment is performed at a temperature of greater than or equal to about 500° C. or greater than or equal to about 600° C. in a subsequent process, formation of oxygen-related deficiencies in the channel structure 130 may be suppressed, Al—O bonds in the gate insulating layer 150 may be increased, C-related impurities may be reduced, and the thin film density may be increased. In addition, even during high-temperature heat treatment, diffusion of elements into the interface layer 155 between the gate insulating layer 150 and the channel structure 130 may be suppressed to improve the properties of the interface layer 155, thereby improving electrical characteristics and ensuring excellent reliability.

For example, the gate insulating layer 150 may have, in an XPS spectrum of O 1s obtained by an X-ray photoelectron spectroscopy (XPS) using a monochromatic aluminum Kα (1486.6 eV) source, a ratio (%) of an Al—O peak observed at a binding energy of about 530.3 eV to about 531.6 eV or about 530.8 eV to about 530.9 eV to all peaks of greater than or equal to about 80%, for example greater than or equal to about 85%, greater than or equal to about 86.5%, greater than or equal to about 87%, greater than or equal to about 87.3%, greater than or equal to about 88%, or greater than or equal to about 89.1%, or less than or equal to about 100%, less than or equal to about 95%, less than or equal to about 89.1%, less than or equal to about 88%, less than or equal to about 87.3%, less than or equal to about 87%, less than or equal to about 86.5%, or less than or equal to about 85%. Within the above ranges, Al—O bonds in the gate insulating layer 150 may be increased, C-related impurities may be reduced, and thin film density may be increased.

In addition, the gate insulating layer 150 may have, in the XPS spectrum of O 1s, a ratio (%) of an OH/CO peak observed at a binding energy of about 531.7 eV to about 532.8 eV or about 532.2 eV to about 532.3 eV to all peaks of less than or equal to about 20%, less than or equal to about 15%, less than or equal to about 13.5%, less than or equal to about 13%, less than or equal to about 12.7%, less than or equal to about 12%, or less than or equal to about 10.9%, or greater than or equal to about 0%, greater than or equal to about 1%, greater than or equal to about 5%, greater than or equal to about 10%, greater than or equal to about 10.9%, greater than or equal to about 12%, greater than or equal to about 12.7%, greater than or equal to about 13%, greater than or equal to about 13.5%, or greater than or equal to about 15%. Within the above ranges, Al—O bonds in the gate insulating layer 150 may be increased, C-related impurities may be reduced, and thin film density may be increased.

For example, the gate insulating layer 150 may have, in a SIMS spectrum obtained by dynamic secondary ion mass spectroscopy (D-SIMS) using a cesium ion ($Cs^+$) source (6 keV), a ratio of an average value of a C intensity to an average value of an Al intensity of less than or equal to about 0.5, less than or equal to about 0.2, less than or equal to about 0.1, or less than or equal to about 0.04, or greater than or equal to about 0.4, greater than or equal to about 0.1, greater than or equal to about 0.03, or greater than or equal to about 0.02. Within the above ranges, Al—O bonds in the gate insulating layer 150 may be increased, C-related impurities may be reduced, and thin film density may be increased.

The gate insulating layer may have a ratio of an average value of an H intensity to an average value of an Al intensity of less than or equal to about 0.2, less than or equal to about 0.1, less than or equal to about 0.05, or less than or equal to about 0.03, or greater than or equal to about 0.1, greater than or equal to about 0.03, greater than or equal to about 0.02, or greater than or equal to about 0.01. Within the above ranges, Al—O bonds in the gate insulating layer 150 may be increased, C-related impurities may be reduced, and thin film density may be increased.

The gate insulating layer may have, in the SIMS spectrum, a ratio of an average value of CO intensity to an average value of an Al intensity of less than or equal to about 0.01, or less than or equal to about 0.001, or greater than or equal to about 0.001, or greater than or equal to about 0. Within the above ranges, Al—O bonds in the gate insulating layer 150 may be increased, C-related impurities may be reduced, and thin film density may be increased.

Accordingly, the thin film density of the gate insulating layer 150 may be greater than or equal to about 3.0 g/$cm^3$, greater than or equal to about 3.1 g/$cm^3$, or less than or equal to about 3.1 g/$cm^3$ or less than or equal to about 3.2 g/$cm^3$.

Meanwhile, the channel structure 130 may have, in an XPS spectrum of O 1s obtained by an X-ray photoelectron spectroscopy using a monochromatic aluminum Kα (1486.6 eV) source, a ratio (%) of an Oder peak observed at a binding energy of about 529.8 eV to about 530.7 eV or about 530.2 eV to about 530.3 eV to all peaks of less than or equal to about 15%, for example less than or equal to about 14%, less than or equal to about 13%, less than or equal to about 12%, less than or equal to about 11%, less than or equal to about 10%, or less than or equal to about 9.6%, or greater than about 0%, greater than or equal to about 1%, greater than or equal to about 5%, or greater than or equal to about 8%. Herein, the Oder peak is a peak for oxygen-related deficiencies. The oxygen-related deficiencies in the channel structure 130 may be reduced within the above ranges.

In addition, the channel structure 130 may have, in the XPS spectrum of O 1s, a ratio (%) of an M-O peak observed at a binding energy of about 528.7 eV to about 529.7 eV or about 529.2 eV to about 529.3 eV to all peaks of greater than or equal to about 82%, greater than or equal to about 83%, greater than or equal to about 83.8%, greater than or equal to about 85%, greater than or equal to about 87.2%, greater than or equal to about 90%, greater than or equal to about 95%, or greater than or equal to about 99%, or less than about 100%, less than or equal to about 99%, less than or equal to about 95%, or less than or equal to about 92%. Herein, the M-O peak is a peak for a bond between metal (M) and oxygen (O). Oxygen-related deficiencies in the channel structure 130 may be reduced within the above ranges.

In addition, the channel structure 130 may have, in the XPS spectrum of O 1s, a ratio (%) of an M-OH peak observed at a binding energy of about 530.8 eV to about 531.8 eV or about 531.2 eV to about 531.3 eV to all peaks of less than or equal to about 3.2%, less than or equal to about 3%, less than or equal to about 2%, or less than or equal to about 1%, or greater than about 0%, greater than or equal to about 1%, greater than or equal to about 2%, or greater than or equal to about 3%. Herein, the M-OH peak is a peak for a bond between a metal (M) and a hydroxyl group (OH). Oxygen-related deficiencies in the channel structure 130 may be reduced within the above ranges.

The semiconductor device 100 may further include an interface layer 155 disposed between the gate insulating layer 150 and the channel structure 130.

For example, when the gate insulating layer 150 includes $Al_2O_3$ and the channel structure 130 includes IGZO (indium gallium zinc oxide), IGSO (indium gallium silicon oxide), ITZO (indium tin zinc oxide), IGTO (indium gallium tin oxide), IZO (indium zinc oxide), GZTO (gallium zinc tin oxide), YGZO (ytterbium gallium zinc oxide), IGO (indium gallium oxide), or a combination thereof, the interface layer 155 may include aluminum (Al), zinc (Zn), gallium (Ga), indium (In), or a combination thereof. That is, as some of the elements of the gate insulating layer 150 and some of the elements of the channel structure 130 are diffused by the high-temperature heat treatment, the interface layer 155 may include both some of the elements of the gate insulating layer 150 and some of the elements of the channel structure 130.

For example, in the semiconductor device 100, a ratio of a thickness of the interface layer 155 to a sum of a thickness of the gate insulating layer 150 and a thickness of the channel structure 130 may be less than or equal to about 40%, less than or equal to about 20%, or greater than or equal to about 28%, or greater than or equal to about 12%. Within the above ranges, diffusion of elements into the interface layer 155 between the gate insulating layer 150 and the channel structure 130 is suppressed to improve the characteristics of the interface layer 155, thereby improving electrical characteristics and securing excellent reliability.

For example, in the ratio of the thickness of the interface layer 155, during line scanning from the gate insulating layer 150 to the channel structure 130 using transmission electron microscope-energy dispersive X-ray analysis (TEM-EDX), the sum of the thickness of the gate insulating layer 150 and the thickness of the channel structure 130 may be the distance from the point where the Al intensity rapidly increases to the point where the Zn intensity rapidly decreases. That is, during line scanning from the gate insulating layer 150 to the channel structure 130, the Al intensity rapidly increases near the start of the gate insulating layer 150, remains constant within the gate insulating layer 150, then rapidly decreases near the interface layer 155 and is hardly observed in the channel structure 130. In addition, the Zn intensity is hardly observed in the gate insulating layer 150, rapidly increases near the interface layer 155, remains constant in the channel structure 150, and then rapidly decreases near the end of the channel structure 150.

Accordingly, the sum of the thickness of the gate insulating layer 150 and the thickness of the channel structure 130 may be a distance from the point where the Al intensity is 50% relative to the maximum Al intensity in the section where the Al intensity rapidly increases, to a point where the Zn intensity is 50% relative to the maximum Zn intensity in the section where the Zn intensity rapidly decreases.

In addition, the thickness of the interface layer 155 may be a section having an Al intensity of about 10% to about 90% relative to the maximum Al intensity and a Zn intensity of about 10% to about 90% relative to the maximum Zn intensity at the same time. That is, the interfacial layer 155 may be a section in which the Al intensity rapidly decreases and the Zn intensity rapidly increases.

Referring back to FIGS. 1 to 3, the second insulating pattern 132 may extend along the second direction (Y direction) on the first insulating pattern 122, and channel structures 130 may be disposed between two adjacent second insulating patterns 132 among the second insulating patterns 132. In addition, a first buried layer 134 and a second buried layer 136 may be disposed in a space between two adjacent second insulating patterns 132 and between two adjacent channel structures 130. The first buried layer 134 may be disposed at the bottom portion of the space between the two adjacent channel structures 130, and the second buried layer 136 may be formed to fill the remainder of the space between two adjacent channel structures 130 on the first buried layer 134. The upper surface of the second buried layer 136 may be disposed at the same level as the upper surface of the channel structures 130, and the second buried layer 136 may cover the upper surface of the gate electrode 140. Alternatively, the second insulating pattern 132 may be formed as a material layer continuous with the first insulating pattern 122, or the second buried layer 136 may be formed as a material layer continuous with the first buried layer 134.

Capacitor contacts 160 may be disposed on the channel structures 130. The capacitor contacts 160 may be arranged to be vertically overlapped with the channel structures 130 and may be arranged in a matrix form spaced apart from each other in a first direction (X direction) and a second direction (Y direction). The capacitor contacts 160 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto.

The upper insulating layer 162 may surround sidewalls of the capacitor contacts 160 on the second insulating pattern 132 and the second buried layer 136.

An etch-stopping layer 170 may be disposed on the upper insulating layer 162, and capacitor structures 180 may be disposed on the etch-stopping layer 170. The capacitor structures 180 may include a lower electrode 182, a capacitor dielectric layer 184, and an upper electrode 186.

The lower electrode 182 may penetrate the etch-stopping layer 170 and be electrically connected to upper surfaces of the capacitor contacts 160. The lower electrode 182 may be formed in a pillar type structure extending in the third direction (Z direction), but is not limited thereto. For example, the lower electrode 182 may be arranged to be vertically overlapped with the capacitor contacts 160 and may be arranged in a matrix form spaced apart from each other in a first direction (X direction) and a second direction (Y direction). Alternatively, a landing pad (not shown) may be further disposed between the capacitor contacts 160 and the lower electrode 182 so that the lower electrode 182 may be arranged in a hexagonal shape.

A semiconductor device 100A according to another embodiment will be described with reference to FIG. 4.

Figure 4:
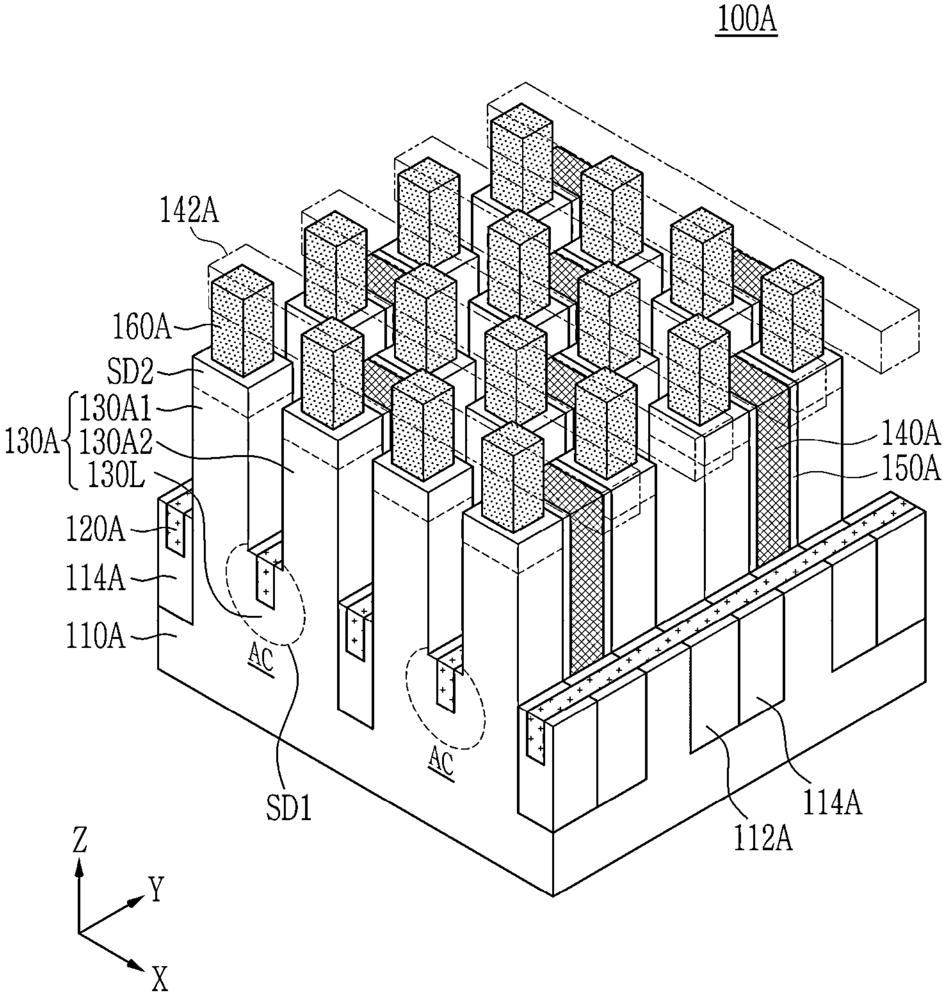
FIG. 4 is a perspective view illustrating a semiconductor device according to another embodiment.

FIG. 4 is a perspective view illustrating a semiconductor device 100A according to another embodiment.

Referring to FIG. 4, the semiconductor device 100A includes a substrate 110A, first conductive lines 120A, channel structures 130A, contact gate electrodes 140A, second conductive lines 142A, and capacitor structures (not shown). The semiconductor device 100A may be a memory device including a vertical channel transistor (VCT).

An active region AC may be defined by the first device isolation layers 112A and the second device isolation layers 114A on the substrate 110A. The channel structures 130A may be disposed in each active region AC, and each of the channel structures 130A may include first and second active pillars 130A1 and 130A2 extending in the third direction (Z direction) and a connection portion 130L connected to the bottom portion of the first active pillar 130A1 and the bottom portion of the second active pillar 130A2. A first source/drain area SD1 may be disposed within the connection portion 130L, and a second source/drain area SD2 may be disposed on the upper side the first active pillar 130A1 and the second active pillar 130A2. The first active pillar 130A1 and the second active pillar 130A2 may constitute independent unit memory cells.

The first conductive lines 120A may extend in a direction crossing each of the active regions AC, and may extend for example in a second direction (Y direction). One of the first conductive lines 120A may be disposed on the connection portion 130L between the first active pillar 130A1 and the second active pillar 130A2, and the one first conductive line 120A may be disposed on the first source/drain area SD1. Another first conductive line 120A adjacent to the one first conductive line 120A may be disposed between the two channel structures 130A. One of the first conductive lines 120A may function as a common bit line included in two unit memory cells constituted by a first active pillar 230A1 and a second active pillar 230A2 disposed on both sides of the one first conductive line 120A.

One contact gate electrode 140A may be disposed between two adjacent channel structures 130A in the second direction (Y direction). For example, the contact gate electrodes 140A may be disposed between a first active pillar 130A1 included in one of the channel structures 130A and a second active pillar 130A2 of the channel structure 130A adjacent thereto. One of the contact gate electrodes 140 may be shared by the first active pillar 130A1 and the second active pillar 130A2 disposed along both sidewalls thereof. A gate insulating layer 150A may be disposed between the contact gate electrode 140A and the first active pillar 130A1 and between the contact gate electrodes 140A and the second active pillar 130A2. The second conductive lines 142A may extend in the first direction (X direction) on the upper surfaces of the contact gate electrodes 140A. The second conductive lines 142A may function as word lines of the semiconductor device 100A.

Capacitor contacts 160A may be disposed on the channel structures 130A. The capacitor contacts 160A may be disposed on the second source/drain region SD2, and capacitor structures may be disposed on the capacitor contacts 160A.

Meanwhile, in the semiconductor device 100A according to another embodiment, the gate insulating layer 150A is formed at a deposition temperature of greater than or equal to about 300° C. or greater than or equal to about 400° C., so that even when heat treatment is performed at a temperature of greater than or equal to about 500° C. or greater than or equal to about 600° C. in a subsequent process, formation of oxygen-related deficiencies in the channel structure 130A may be suppressed, Al—O bonds in the gate insulating layer 150A may be increased, C-related impurities may be reduced, and the thin film density may be increased. In addition, even during high-temperature heat treatment, diffusion of elements into the interface layer (not shown) between the gate insulating layer 150A and the channel structure 130A may be suppressed to improve the properties of the interface layer, thereby improving electrical characteristics and ensuring excellent reliability.

Accordingly, since the ratio (%) of the Al—O peak to all peaks and the ratio (%) of the OH/CO peak to all peaks in the XPS spectrum of O 1s of the gate insulating layer 150A; the ratio between the average Al intensity and the average C intensity, the ratio between the average Al intensity and the average H intensity, and the ratio between the average Al intensity and the average CO intensity in the SIMS spectrum of the gate insulating layer 150A; and the thin film density of the gate insulating layer 150A are the same as that described in the semiconductor device 100 according to an embodiment, repetitive descriptions thereof are omitted.

In addition, since in the XPS spectrum of O 1s of the channel structure 130A, the ratio (%) of the $O_{def}$ peak to all peaks, the ratio (%) of the M-O peak to all peaks, and the ratio of the M-OH peak to all peaks (%) are also the same as that described in the semiconductor device 100 according to an embodiment, repetitive descriptions thereof are omitted.

Also, the semiconductor device 100A according to another embodiment may further include an interface layer disposed between the gate insulating layer 150A and the channel structure 130A, and including aluminum (Al), zinc (Zn), gallium (Ga), indium (In), or a combination thereof. Since the ratio of the thickness of the interface layer to the sum of the thickness of the gate insulating layer 150A and the thickness of the channel structure 130A is the same as that described in the semiconductor device 100 according to an embodiment, repetitive descriptions thereof are omitted.

A semiconductor device 100B according to another embodiment will be described with reference to FIG. 5.

Figure 5:
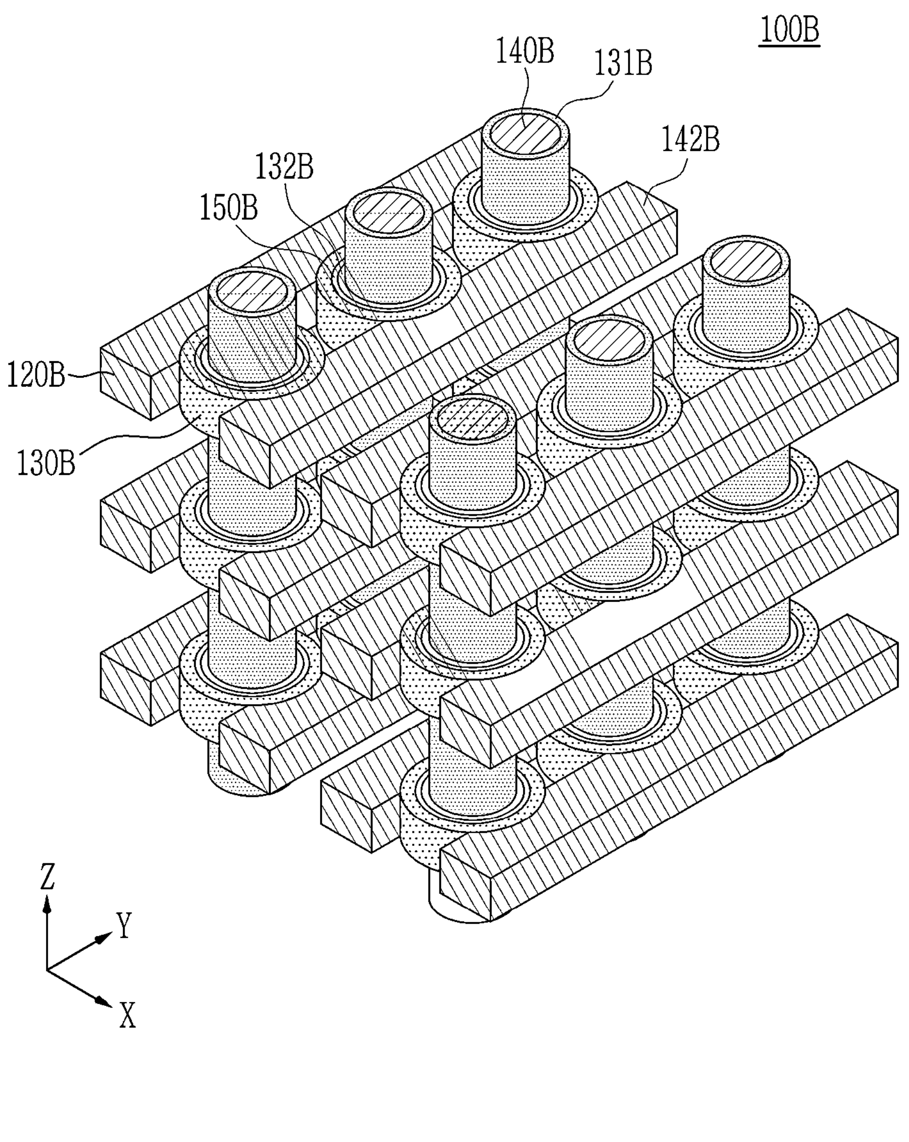
FIG. 5 is a perspective view illustrating a semiconductor device according to another embodiment.

FIG. 5 is a perspective view illustrating a semiconductor device 100B according to another embodiment.

Referring to FIG. 5, the semiconductor device 100B includes first conductive lines 120B and second conductive lines 142B, gate electrodes 140B, channel structures 130B, a ferroelectric layer 131B, a metal layer 132B, and a gate insulating layer 150B. The semiconductor device 100B may be a ferroelectric field effect transistor (FeFET) memory device.

The first conductive lines 120B and the second conductive lines 142B are spaced apart from each other in a third direction (Z direction) perpendicular to the upper surface of the substrate (not shown). The second conductive lines 142B are spaced apart from the first conductive lines 120B along a first direction (X direction) parallel to the upper surface of the substrate.

The first conductive lines 120B and the second conductive lines 142B may extend along a second direction (Y direction) parallel to the upper surface of the substrate. Herein, the second direction (Y direction) may cross the first direction (X direction). The second conductive lines 142B may extend parallel to the first conductive lines 120B along the second direction (Y direction).

For example, the first conductive lines 120B may function as bit lines, and the second conductive lines 142B may function as source lines. As another example, the first conductive lines 120B may function as source lines, and the second conductive lines 142B may function as bit lines.

The gate electrodes 140B are disposed between the first conductive lines 120B and the second conductive lines 142B. The gate electrodes 140B may cross the first conductive lines 120B and the second conductive lines 142B. The gate electrodes 140B may be spaced apart from each other in the second direction (Y direction) between the first conductive lines 120B and the second conductive lines 142B, and may be extended in the third direction (Z direction).

The channel structures 130B may surround respective side surfaces of the gate electrodes 140B. The channel structures 130B may be spaced apart from each other in the third direction (Z direction). The channel structures 130B may be disposed between the first conductive lines 120B and the second conductive lines 142B. The first conductive lines 120B may be respectively connected to the channel structures 130B, and the second conductive lines 142B may be respectively connected to the channel structures 130B.

Each of the channel structures 130B may be connected to its corresponding first conductive line 120B among the first conductive lines 120B and its corresponding second conductive line 142B among the second conductive lines 142B. In addition, each of the channel structures 130B may be disposed between the corresponding first conductive line 120B and the corresponding second conductive line 142B. For example, the corresponding first conductive line 120B, each of the corresponding channel structures 130B, and the corresponding second conductive line 142B may be horizontally overlapped.

Each of the first conductive lines 120B may extend in the second direction (Y direction) and be connected to its adjacent channel structures 130B respectively surrounding the side surfaces of the gate electrodes 140B. Each of the second conductive lines 142B may extend in the second direction (Y direction) and be connected to its adjacent channel structures 130B.

The semiconductor device 100B may further include the ferroelectric layer 131B disposed between each of the channel structures 130B and its corresponding gate electrode 140B, a metal layer 132B disposed between each of the channel structures 130B and its corresponding ferroelectric layer 131B, and a gate insulating layer 150B disposed between each of the channel structures 130B and the metal layer 132B.

The ferroelectric layer 131B may surround the side surface of the corresponding gate electrode 140B. The metal layer 132B may surround the side surface of the corresponding gate electrode 140B and be disposed with a space apart from each other from the side surface of the corresponding gate electrode 140B with the ferroelectric layer 131B interposed therebetween. The gate insulating layer 150B may surround the side surface of the corresponding gate electrode 140B and be spaced apart from the side surface of the corresponding gate electrode 140B with the ferroelectric layer 131B and the metal layer 132B interposed therebetween.

For example, the ferroelectric layer 131B may include an Hf oxide having ferroelectric properties. The ferroelectric layer 131B may further include a dopant, and the dopant may be Zr, Si, Al, Y, Gd, La, Sc, Sr, or a combination thereof. For example, the ferroelectric layer 131B may include $HfO_2$, HfZnO, HfSiO, HfSiON, HfTaO, HfTiO, HfZrO, or a combination thereof. The ferroelectric layer 131B may have an orthorhombic phase.

For example, the metal layer 132B may include a metal such as Pt and the like; a metal oxide such as $RuO_2$, $IrO_2$, $LaSrCoO_3$, and the like, or a combination thereof. The metal layer 132B may be used to easily maintain polarization of the ferroelectric layer 131B.

Meanwhile, in the semiconductor device 100B according to another embodiment, the gate insulating layer 150B is formed at a deposition temperature of greater than or equal to about 300° C. or greater than or equal to about 400° C., so that even when heat treatment is performed at a temperature of greater than or equal to about 500° C. or greater than or equal to about 600° C. in a subsequent process, formation of oxygen-related deficiencies in the channel structure 130B may be suppressed, Al—O bonds in the gate insulating layer 150B may be increased, C-related impurities may be reduced, and the thin film density may be increased. In addition, even during high-temperature heat treatment, diffusion of elements into the interface layer (not shown) between the gate insulating layer 150B and the channel structure 130B may be suppressed to improve the properties of the interface layer, thereby improving electrical characteristics and ensuring excellent reliability.

Accordingly, since the ratio (%) of the Al—O peak to all peaks and the ratio (%) of the OH/CO peak to all peaks in the XPS spectrum of O 1s of the gate insulating layer 150B; the ratio between the average Al intensity and the average C intensity, the ratio between the average Al intensity and the average H intensity, and the ratio between the average Al intensity and the average CO intensity in the SIMS spectrum of the gate insulating layer 150B; and the thin film density of the gate insulating layer 150A are the same as that described in the semiconductor device 100 according to an embodiment, repetitive descriptions thereof are omitted.

In addition, since in the XPS spectrum of O 1s of the channel structure 130B, the ratio (%) of the $O_{def}$ peak to all peaks, the ratio (%) of the M-O peak to all peaks, and the ratio of the M-OH peak to all peaks (%) are also the same as that described in the semiconductor device 100 according to an embodiment, repetitive descriptions thereof are omitted.

Also, the semiconductor device 100B according to another embodiment may further include an interface layer disposed between the gate insulating layer 150B and the channel structure 130B, and including aluminum (Al), zinc (Zn), gallium (Ga), indium (In), or a combination thereof. Since the ratio of the thickness of the interface layer to the sum of the thickness of the gate insulating layer 150B and the thickness of the channel structure 130B is the same as that described in the semiconductor device 100 according to an embodiment, repetitive descriptions thereof are omitted.

Hereinafter, a method of manufacturing the semiconductor device 100 according to an embodiment is illustrated.

On the substrate 110, a lower insulating layer 112 is formed, first conductive lines 120 spaced apart each other in the first direction (X direction) and extended in the second direction (Y direction) are formed on the lower insulating layer 112, and a first insulating pattern 122 is formed by filling an insulating material between the first conductive lines 120. The first conductive lines 120 may be formed by depositing a conductive layer on the lower insulating layer 112 and patterning the conductive layer.

The second insulating pattern 132 defining first trenches spaced apart from each other in a first direction (X direction) and extending in a second direction (Y direction) may be formed on the first conductive lines 120. The first trenches may be formed to cross the first conductive lines 120.

A channel material layer may be conformally deposited on the top and side surfaces of the second insulating pattern 132 and the upper surfaces of the first conductive lines 120.

For example, the channel material layer may be formed by a physical vapor deposition (PVD), thermal chemical vapor deposition (thermal CVD), low pressure chemical vapor deposition (LP-CVD), plasma enhanced chemical vapor deposition (PE-CVD), or atomic layer deposition (ALD) method.

For example, the channel material layer may include an oxide semiconductor, and the oxide semiconductor may include, for example, IGZO (indium gallium zinc oxide), IGSO (indium gallium silicon oxide), ITZO (indium tin zinc oxide), IGTO (indium gallium tin oxide), IZO (indium zinc oxide), ZnO (zinc oxide), ZTO (zinc tin oxide), ZnON (zinc oxynitride), ZZTO (zirconium zinc tin oxide), SnO (tin oxide), HIZO (hafnium indium zinc oxide), GZTO (gallium zinc tin oxide), AZTO (aluminium zinc tin oxide), YGZO (ytterbium gallium zinc oxide), IGO (indium gallium oxide), or a combination thereof. The channel material layer may include a single layer or multiple layers of oxide semiconductors.

The channel structures 130 may be formed in the first trench by patterning the channel material layer. For example, after forming a sacrificial pattern to fill the first trench in the first trench, the channel material layer disposed on the upper surface of the second insulating pattern 132 may be patterned to expose the upper surface of the second insulating pattern 132.

Accordingly, the channel structures 130 may be formed along the profile of the first trench, and upper surfaces of the channel structures 130 may be disposed at substantially the same level as the upper surface of the second insulating pattern 132. The channel structures 130 may be portions of the channel material layer remaining in the first trench during patterning of the channel material layer.

A gate insulating material layer and a gate electrode material layer conformally covering the second insulating pattern 132 and the channel structures 130 may be sequentially deposited.

The gate insulating material layer and the gate electrode material layer may be formed by a physical vapor deposition (PVD), thermal chemical vapor deposition (thermal CVD), low pressure chemical vapor deposition (LP-CVD), plasma enhanced chemical vapor deposition (PE-CVD), or atomic layer deposition (ALD) method.

The gate insulating material layer may include a silicon oxide layer, a silicon oxynitride layer, a high dielectric layer having a higher dielectric constant than the silicon oxide layer, or a combination thereof. The high dielectric layer may be made of metal oxide or metal oxynitride. For example, the high dielectric layer usable as a gate insulating material layer may include $HfO_2$, HfSiO, HfSiON, HfTaO, HfTiO, HfZrO, $ZrO_2$, $Al_2O_3$, or a combination thereof.

For example, when the gate insulating material layer includes $Al_2O_3$, the gate insulating material layer may be formed by using a reactant including trimethylaluminum (TMA) and $O_3$ in an atomic layer deposition (ALD) method at a deposition temperature of greater than or equal to about 300° C. or greater than or equal to about 400° C.

Through this, in the subsequent processes, for example, the process of forming the gate electrode material layer, the process of forming the gate electrodes 140 by etching it, the process of forming the capacitor contacts 160, and the process of forming the capacitor structures 180, or a combination thereof, even when heat treatment is performed at a temperature of greater than or equal to about 500° C. or greater than or equal to about 600° C., formation of oxygen-related deficiencies in the channel structure 130 may be suppressed, Al—O bonds in the gate insulating layer 150 may be increased, C-related impurities may be reduced, and the thin film density may be increased. In addition, even during high-temperature heat treatment, diffusion of elements into the interface layer 155 between the gate insulating layer 150 and the channel structure 130 may be suppressed to improve the properties of the interface layer 155, thereby improving electrical characteristics and ensuring excellent reliability.

Next, a process of etching the gate insulating material layer and the gate electrode material layer is performed to form the gate insulating layer 150 and the gate electrodes 140 in the first trench. In other words, the etching process of the gate electrode material layer is performed to form a pair of the gate electrodes 140 spaced apart from each other in the second direction (Y direction) in the first trench.

In other words, the gate insulating layer 150 and the gate electrodes 140 may be each portion of the gate insulating material layer and the gate electrode material layer remaining in the first trench during the etching of the gate insulating material layer and the gate electrode material layer.

A portion of the channel structures 130 may be recessed through an etching process, forming a second trench. For example, the portion of the channel structures 130 from the upper surface toward the bottom surface is wet etched, forming the second trench extended along the third direction (Z direction). Accordingly, the upper surface of the channel structures 130 may exist lower than the upper surface of the gate electrodes 140. The wet etching of the portion of the channel structures 130 may be performed by using an etching solution selectively etching the channel structures 130. However, the etching process of recessing the channel structures 130 is not limited thereto but may be variously modified.

Capacitor contacts 160 may be formed to fill the second trench and be connected to the channel structures 130. Subsequently, capacitor structures 180 may be respectively formed on the capacitor contacts 160. For example, each of the capacitor structures 180 may be formed by sequentially forming a lower electrode 182, a capacitor dielectric layer 184, and an upper electrode 186.

Hereinafter, specific examples of the disclosure are presented. However, the examples described below are only intended to specifically illustrate or explain the disclosure, and the scope of the disclosure should not be limited thereto.

PREPARATION EXAMPLES

Preparation Example 1: Deposition of ALD-IGZO Channel Layer

In order to deposit $In_2O_3$, $Ga_2O_3$, and ZnO, a lateral flow type plasma-enhanced ALD (PEALD) system with a wireless frequency (13.56 MHZ) and a direct capacitance-couple plasma (CCP) source (ISAC Research Inc.) was used.

Argon (Ar) (purity: 99.999%) was used as a carrier gas during the deposition.

(3-dimethylaminopropyl)dimethyl indium (DADI), trimethylgallium (TMGa), and diethylzinc (DEZ) were respectively used as In, Ga, and Zn precursors.

An oxygen ($O_2$) plasma of electric power of 100 W was used as a reactant.

A deposition temperature was fixed at 200° C., and a pressure was fixed at 1.2 Torr.

An IGZO channel layer was deposited in a super-cycle method consisting of $In_2O_3$, $Ga_2O_3$, and ZnO. The super-cycle number of $In_2O_3$, $Ga_2O_3$, and ZnO was 6, 1, and 1, respectively.

The deposited IGZO channel layer had a cation composition derived from X ray fluorescence (XRF) of $In_{0.52}Ga_{0.18}Zn_{0.30}O$.

Preparation Example 2: Deposition of ALD-$Al_2O_3$ Gate Insulating Layer

An $Al_2O_3$ film was deposited by using a trimethylaluminum (TMA) precursor in a vertical flow ALD chamber (ISAC Research Inc.).

Argon (Ar) (purity: 99.999%) was used as a carrier gas to maintain a pressure of 350 mTorr during the deposition.

As a reactant, ozone ($O_3$) produced by using an $O_3$ generator (CN-1, OzoneTech Co.) was used. The ozone ($O_3$) was maintained at a concentration of 200 g/m$^3$.

In order to examine an effect of a deposition temperature on characteristics of a film and a device, the temperature was increased from 200° C. to 400° C.

In the $Al_2O_3$ deposition, ALD process steps and cycle time were as follows: TMA dose (0.1 sec), Ar purge (25 sec), $O_3$ dose (5 sec), and Ar purge (20 sec).

Preparation Example 3: Manufacture of ALD-IGZO TFT

Top-gate bottom-contact (TG-BC) ALD-IGZO TFT was manufactured by increasing a deposition temperature of a gate insulating layer (GI) to 200° C., 300° C., 350° C., and 400° C., respectively.

The manufacturing process started with ultrasonic cleaning of a thermally grown 100 nm-thick $SiO_2$ buffer substrate by sequentially using acetone, ethanol, and deionized water.

Subsequently, a 100 nm-thick ITO electrode was deposited through RF sputtering to define a source and drain region through photolithography.

Then, an 8 nm-thick IGZO channel layer was deposited by using PEALD and defined through conventional photolithography.

Subsequently, a 13 nm-thick $Al_2O_3$ layer was deposited by ALD, and a contact hole for the source/drain was opened through a wet etching process.

A gate electrode was formed by depositing and patterning a 100 nm-thick ITO layer through photolithography.

IGZO TFT had a width and a length of 40 μm and 20 μm, respectively.

Finally, the device was dried at room temperature in the air ($O_2$ 21%/$N_2$ 79%, purity: 99.999%) for 2 hours and annealed at 350° C. and 600° C., respectively.

Measurement Methods

A chemical bond and a sub-gap state near the valence band maximum (VBM) were measured by using a monochromatic aluminum (Al) Kα (1486.6 eV) source through an X-ray photoelectron spectroscopy (XPS, K-alpha, Thermo Fisher Scientific) analysis.

A cross section of $Al_2O_3$/IGZO was examined through transmission electron microscopy (TEM) and energy dispersive spectroscopy (EDS) line scan by using high-resolution TEM (HRTEM, Talos F200X, Thermo Fisher Scientific).

Crystallinity of IGZO and thin film density of $Al_2O_3$ were respectively analyzed by using Cu-Kα (1.5405 Å) target through grazing incidence X-ray diffraction (GI-XRD, SmartLab, Rigaku Corp.) and GI-X-ray reflectometry (GI-XRR, SmartLab, Rigaku Corp.), respectively.

The number of light materials such as carbon (C), hydrogen (H), and carbon monoxide (CO) was counted by using a cesium (Cs) ion source (6 keV) through dynamic secondary ion mass spectroscopy (D-SIMS, IMS-7F_Auto, CAMECA).

Electrical characteristics of IGZO TFT and $Al_2O_3$ were measured by using a TOP Engineering S3000 electrical parameter analyzer and an Agilent 4284A precision LCR meter.

A technology computer-aided design (TCAD) was used to verify a positive bias temperature stress (PBTS) decomposition mechanism as a function of a gate insulating layer (GI) deposition temperature. A density-of-state (DOS) model was adopted for an IGZO layer according to experimental electrical characteristics of the manufactured TG-BC ALD-IGZO TFT.

Measurement Results

Figure 6:
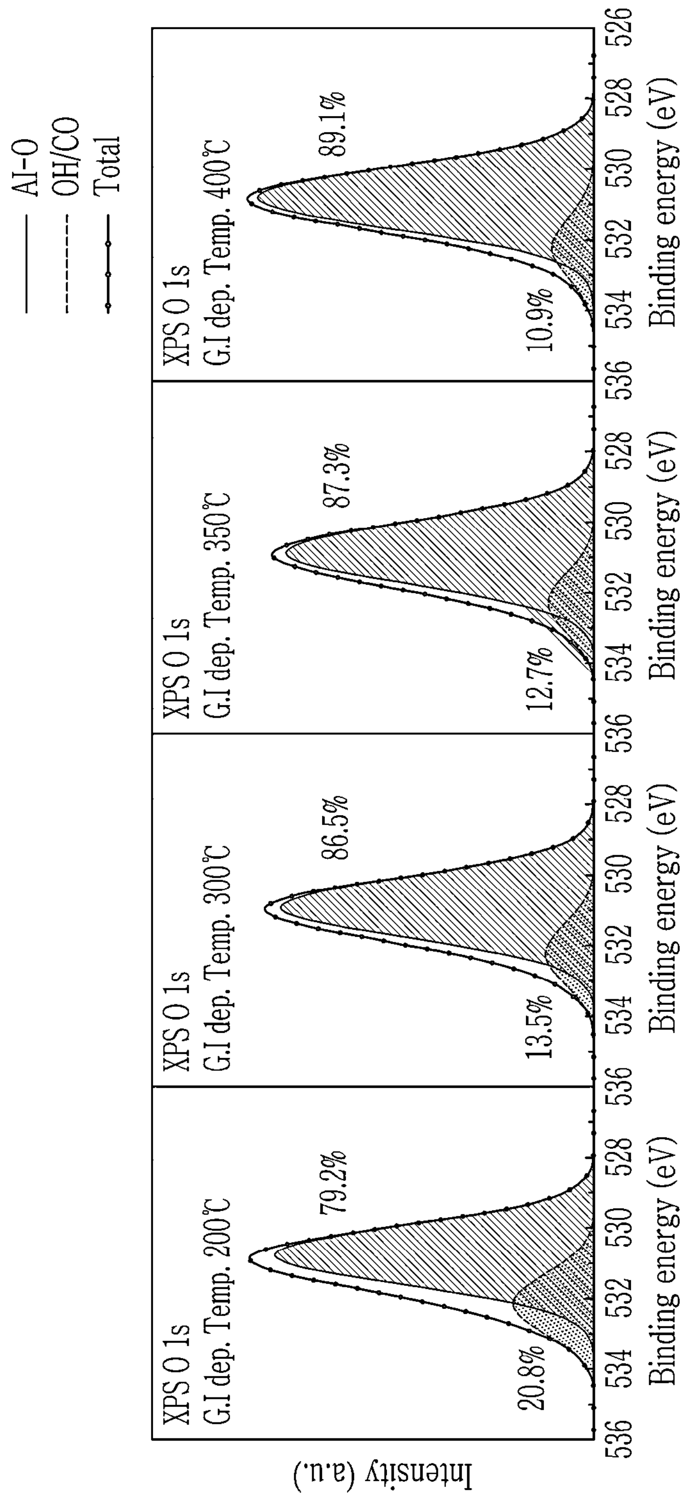
FIG. 6 shows an XPS O 1s spectrum of an $Al_2O_3$/a-IGZO stacked film according to a deposition temperature of a gate insulating layer.

FIG. 6 is an XPS O 1s spectrum of an $Al_2O_3$/a-IGZO stacked film according to a deposition temperature of a gate insulating layer. An XPS O 1s peak with a binding energy center peak determined from NIST database was deconvolved through 3-Gaussian fitting (M-O, $O_{def}$, M-OH). Subsequently, a ratio of each peak was compared as a function of deposition temperature.

Referring to FIG. 6, a stacked film deposited with $Al_2O_3$ at 200° C. exhibited an Al—O peak ratio (%) of 79.2%, a stacked film deposited with $Al_2O_3$ at 300° C. exhibited an Al—O peak ratio (%) of 86.5%, a stacked film deposited with $Al_2O_3$ at 350° C. exhibited an Al—O peak ratio (%) of 87.3%, and a stacked film deposited with $Al_2O_3$ at 400° C. exhibited an Al—O peak ratio (%) of 89.1%.

In addition, the stacked film deposited with $Al_2O_3$ at 200° C. exhibited an OH/CO peak ratio (%) of 20.8%, the stacked film deposited with $Al_2O_3$ at 300° C. exhibited an OH/CO peak ratio (%) of 13.5%, the stacked film deposited with $Al_2O_3$ at 350° C. exhibited an OH/CO peak ratio (%) of 12.7%, and the stacked film deposited with $Al_2O_3$ at 400° C. exhibited an OH/CO peak ratio (%) of 10.9%.

In other words, as the deposition temperature increased, the Al—O peak ratio after annealing at 600° C. increased, but the OH/CO peak ratio decreased.

Figure 7:
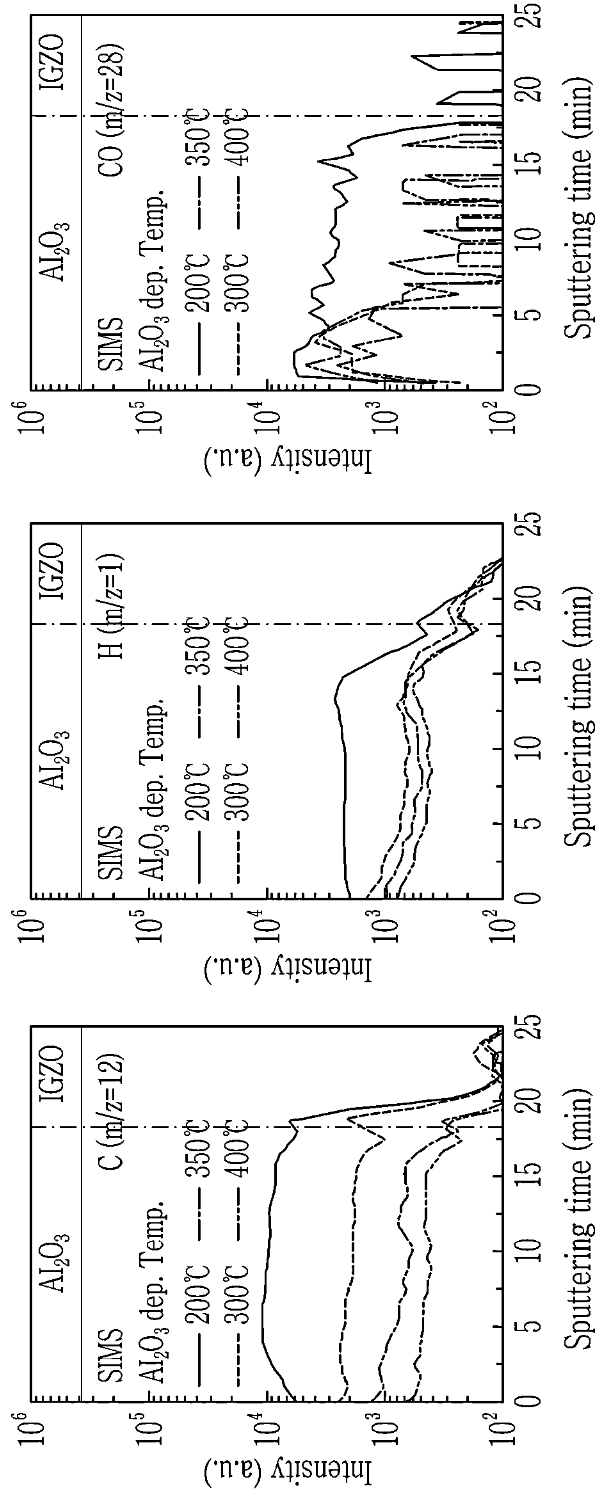
FIG. 7 is a graph showing the results of SIMS analysis of light elements of the $Al_2O_3$/a-IGZO stacked film after annealing at 600° C.

FIG. 7 is a graph showing the SIMS analysis results of the light materials of the $Al_2O_3$/a-IGZO stacked films after annealing at 600° C.

Referring to FIG. 7, the stacked film deposited with $Al_2O_3$ at 200° C. exhibited an average Al and C intensity ratio of 1:0.4, the stacked film deposited with $Al_2O_3$ at 300° C. exhibited an average Al and C intensity ratio of 1:0.1, the stacked film deposited with $Al_2O_3$ at 350° C. exhibited an average Al and C intensity ratio of 1:0.03, and the stacked film deposited with $Al_2O_3$ at 400° C. exhibited an average Al and C intensity ratio of 1:0.02.

In addition, the stacked film deposited with $Al_2O_3$ at 200° C. exhibited an average Al and H intensity ratio of 1:0.1, the stacked film deposited with $Al_2O_3$ at 300° C. exhibited an average Al and H intensity ratio of 1:0.03, the stacked film deposited with $Al_2O_3$ at 350° C. exhibited an average Al and H intensity ratio of 1:0.02, and the stacked film deposited with $Al_2O_3$ at 400° C. exhibited an average Al and H intensity ratio of 1:0.01.

In addition, the stacked film deposited with $Al_2O_3$ at 200° C. exhibited an average Al to CO intensity ratio of 1:0.001, the stacked film deposited with $Al_2O_3$ at 300° C. exhibited an average Al to CO intensity ratio of 1:0, the stacked film deposited with $Al_2O_3$ at 350° C. exhibited an average Al to CO intensity ratio of 1:0, and the stacked film deposited with $Al_2O_3$ at 400° C. exhibited an average Al to CO intensity ratio of 1:0.

In other words, as the deposition temperature increased, C and H impurities of $Al_2O_3$ gradually decreased, which means that the increased deposition temperature supplied more thermal energy to a chemical reaction between precursor and oxidizing agent, reducing the number of $CH_3$ groups.

In addition, the CO intensity after annealing at 600° C. decreased according to the deposition temperature of $Al_2O_3$ and finally was impossible to analyze at 300° C. or more due to a detection limit of the SIMS analysis.

Figure 8:
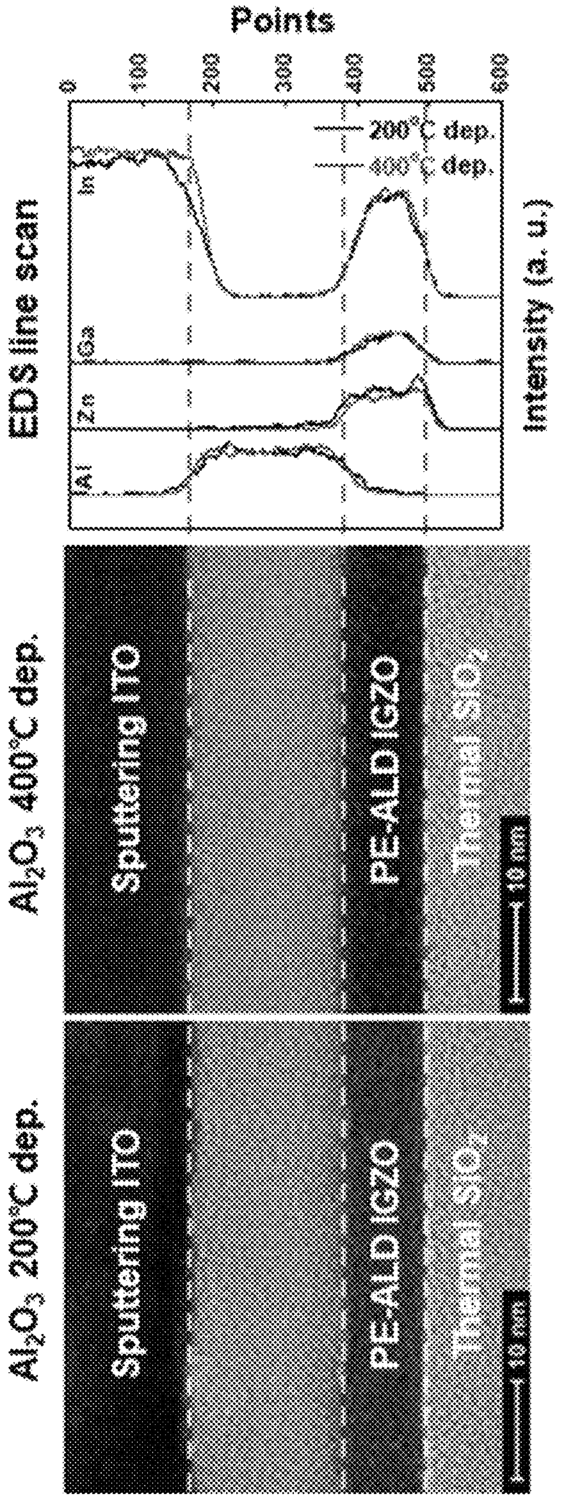
FIG. 8 shows cross-sectional TEM images and EDS line scan spectra of $Al_2O_3$/a-IGZO stacked films at deposition temperatures of 200° C. and 400° C. for $Al_2O_3$.

FIG. 8 is a TEM image and an EDS line scan spectrum of a cross section of the $Al_2O_3$/a-IGZO stacked films at the $Al_2O_3$ deposition temperatures of 200° C. and 400° C.

In order to examine an effect of the $Al_2O_3$ deposition temperature on structural changes, the $Al_2O_3$/a-IGZO stacked films were annealed at a high temperature of 600° C.

Referring to FIG. 8, there was no boundary layer simultaneously containing aluminum (Al) and zinc (Zn) between $Al_2O_3$ and a-IGZO.

Herein, the $Al_2O_3$/a-IGZO stacked film with the $Al_2O_3$ deposition temperature of 200° C. exhibited a ratio of a thickness of the interface layer to a thickness sum of the gate insulating layer and the channel structure of 28%, and the $Al_2O_3$/a-IGZO stacked film with the $Al_2O_3$ deposition temperature of 400° C. exhibited a ratio of a thickness of the interface layer to a thickness sum of the gate insulating layer and the channel structure of 12%.

Herein, a sum of a thickness of the $Al_2O_3$ and a thickness of the a-IGZO was measured as a distance from the point where the Al intensity is about 50% (intensity: 16.1) relative to the maximum Al intensity (intensity: 32.2) in the section where the Al intensity rapidly increases, to a point where the Zn intensity is about 50% (intensity: 16.5) relative to the maximum Zn intensity (intensity: 32.9) in the section where the Zn intensity rapidly decreases, and a thickness of the interface layer was measured as a section (point: 378 to 431) having about 10% to about 90% of Al intensity (intensity: 2.4 to 21.8) relative to the maximum Al intensity (intensity: 24.2) and about 10% to about 90% of Zn intensity (intensity: 2.2 to 19.4) relative to the maximum Zn intensity (intensity: 21.6) at the same time.

In other words, compared with an $Al_2O_3$ specimen with the $Al_2O_3$ deposition temperature of 200° C., an $Al_2O_3$ specimen with the $Al_2O_3$ deposition temperature of 400° C. exhibited a steeper slope of Al intensity near an interface layer between $Al_2O_3$ and a-IGZO layers as shown in the EDS line scan.

The reason is that as the deposition temperature increased from 200° C. to 400° C., density of the $Al_2O_3$ thin film gradually increased from 2.96 g/cm$^3$ to 3.12 g/cm$^3$, so that Al penetrated deeper according to the thin film density.

In order to examine relationship between C impurities in $Al_2O_3$ and Vo production a-IGZO, when annealed at a high temperature of 600° C., XPS O 1s in the $Al_2O_3$/a-IGZO stacked films was analyzed.

Figure 9:
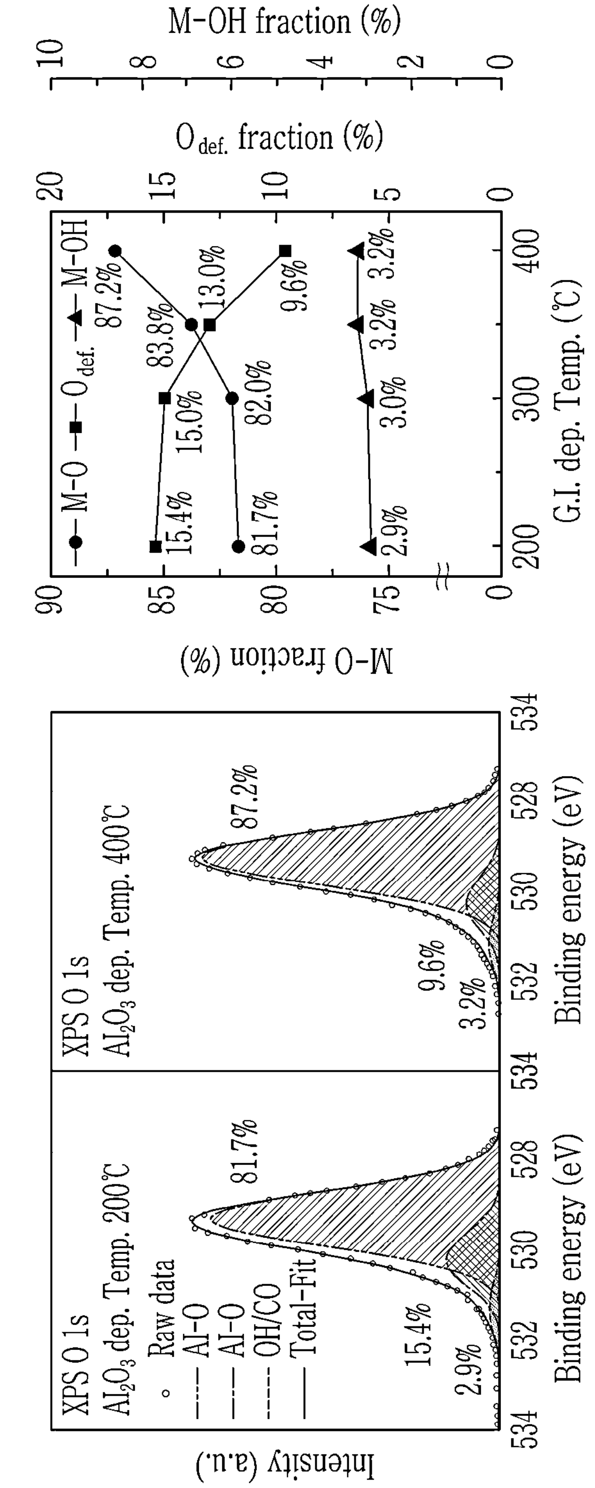
FIG. 9 shows an XPS O 1s spectrum of the channel layer after annealing the $Al_2O_3$/a-IGZO stacked film at 600° C. where the deposition temperature of $Al_2O_3$ is 200° C. and 400° C.

FIG. 9 is an XPS O 1s spectrum of a channel layer after annealing the $Al_2O_3$/a-IGZO stacked films at 600° C. in which $Al_2O_3$ was deposited at 200° C. and 400° C. A fraction of each peak was calculated by deconvolution of an XPS O 1s peak by using 3-Gaussian fitting (M-O, $O_{def}$ and M-OH).

Referring to FIG. 9, the stacked film deposited with $Al_2O_3$ at 200° C. exhibited an $O_{def}$ peak ratio (%) of 15.4%, the stacked film deposited with $Al_2O_3$ at 300° C. exhibited an $O_{def}$ peak ratio (%) of 15.0%, the stacked film deposited with $Al_2O_3$ at 350° C. exhibited an $O_{def}$ peak ratio (%) of 13.0%, and the stacked film deposited with $Al_2O_3$ at 400° C. exhibited an $O_{def}$ peak ratio (%) of 9.6%.

In addition, the stacked film deposited with $Al_2O_3$ at 200° C. exhibited an M-O peak ratio (%) of 81.7%, the stacked film deposited with $Al_2O_3$ at 300° C. exhibited an M-O peak ratio (%) of 82.0%, the stacked film deposited with $Al_2O_3$ at 350° C. exhibited an M-O peak ratio (%) of 83.8%, and the stacked film deposited with $Al_2O_3$ at 400° C. exhibited an M-O peak ratio (%) of 87.2%.

Furthermore, the stacked film deposited with $Al_2O_3$ at 200° C. exhibited an M-OH peak ratio (%) of 2.9%, the stacked film deposited with $Al_2O_3$ at 300° C. exhibited an M-OH peak ratio (%) of 3.0%, the stacked film deposited with $Al_2O_3$ at 350° C. exhibited an M-OH peak ratio (%) of 3.2%, and the stacked film deposited with $Al_2O_3$ at 400° C. exhibited an M-OH peak ratio (%) of 3.2%.

In addition, Vo deficiencies generated by the annealing at the high temperature of 600° C. steadily decreased from 15.4% to 9.6% according to an increase in the $Al_2O_3$ deposition temperature. Without being bound by any particular theory, since the C impurities were reduced by additional thermal energy during the ALD process, as the $Al_2O_3$ deposition temperature decreased, O removal effects of a-IGZO after the heat treatment at 600° C. were assumed to be deteriorated.

This result means that Vo changes of a-IGZO were more sensitive to C than H of $Al_2O_3$. The reason is that in the $Al_2O_3$/a-IGZO stacked film prepared at the high $Al_2O_3$ deposition temperature, an H content of a-IGZO was negligible after the high temperature annealing.

In order to evaluate electrical characteristics and Vo changes of a-IGZO of an $Al_2O_3$ deposition temperature, TG-BC a-IGZO TFT was manufactured and then, annealed at the high temperature of 600° C., and the results are shown in Table 1.

TABLE 1

| $Al_2O_3$ deposition temperature (° C.) | $V_{TH}$ (V) | $\mu_{FE}$ ($cm^2$/Vs) | SS (mV/dec.) | Hysteresis (V) |
|---|---|---|---|---|
| 200 | 0.01 ± 0.07 | 17.2 ± 0.9 | 68 ± 1 | 0.03 ± 0.01 |
| 300 | −0.02 ± 0.01 | 22.1 ± 0.3 | 63 ± 1 | 0.00 ± 0.00 |
| 350 | −0.06 ± 0.01 | 25.6 ± 0.8 | 63 ± 3 | 0.00 ± 0.00 |
| 400 | 0.05 ± 0.02 | 27.6 ± 0.2 | 61 ± 1 | 0.01 ± 0.00 |

Referring to Table 1, a-IGZO TFTs with the $Al_2O_3$ deposition temperatures of 200° C., 300° C., 350° C., and 400° C. exhibited little changes in $V_{TH}$ but improvement in $\mu_{FE}$, SS, and hysteresis as the $Al_2O_3$ deposition temperature increased.

In particular, the device in which $Al_2O_3$ was grown at 400° C. exhibited SS of 61±1 mV/decade, which is similar to theoretical minimum SS of 60 mV/decade. In addition, very low SS indicates that deficiencies of a channel layer and an interface layer between the channel layer and GI were minimized by the $Al_2O_3$ deposition temperature after the high temperature annealing. Furthermore, $\mu_{FE}$ was gradually increased from 17.2 $cm^2$/Vs to 27.6 $cm^2$/Vs as the $Al_2O_3$ deposition temperature increased.

Figure 10:
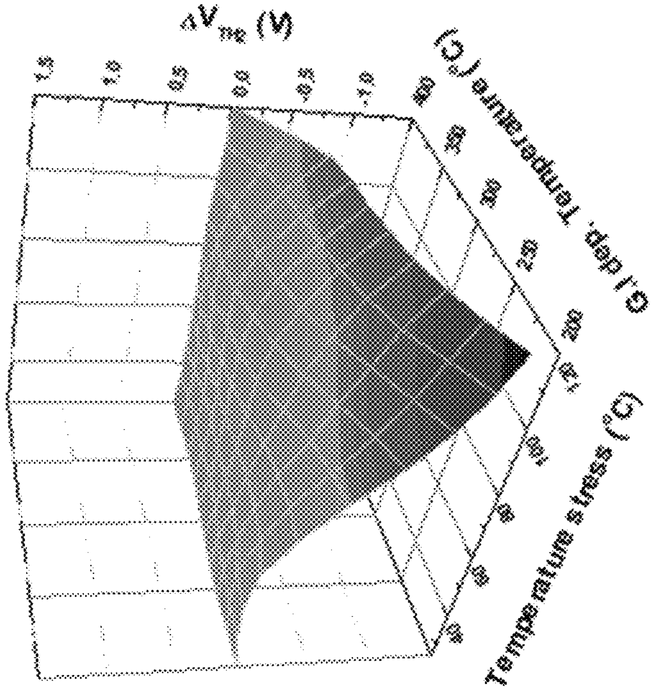
FIG. 10 is a graph showing the change in $V_{TH}$ shift under positive bias temperature stress (PBTS) as a function of thermal stress and $Al_2O_3$ deposition temperature.
Figure 10:
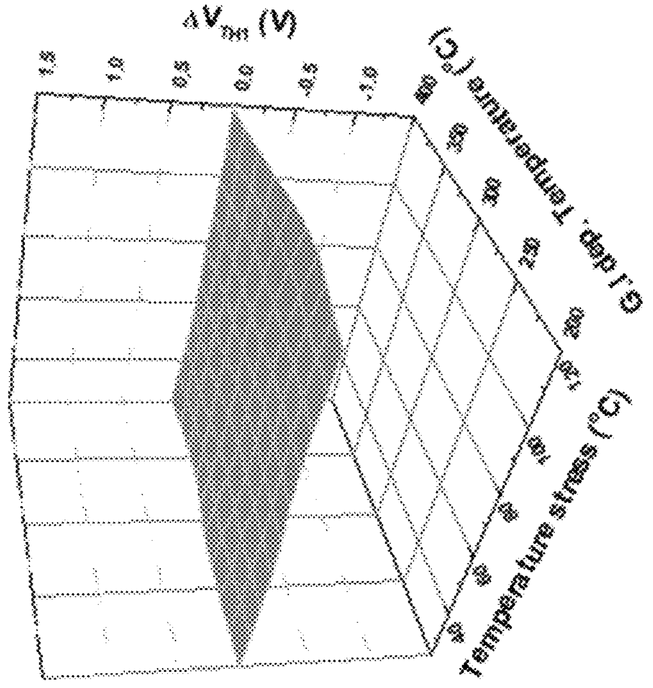

FIG. 10 is a graph showing a $V_{TH}$ shift change under PBTS as a function of thermal stress and the $Al_2O_3$ deposition temperature.

Since the $V_{TH1}$ change was negligible in the device, the negative $V_{TH2}$ change indicates abnormal hump characteristics under the PBTS condition.

Referring to FIG. 10, the abnormal characteristics under the harsh PBTS condition were significantly improved as the $Al_2O_3$ deposition temperature increased. In particular, the device with an $Al_2O_3$ deposition temperature of 400° C. exhibited a $V_{TH}$ shift of 0.00 V at a temperature stress of 120° C., which is a very reliable PBTS result.

As such, according to embodiments, the semiconductor device may suppress the formation of oxygen-related deficiencies in a channel structure, increase Al—O bonds in a gate insulating layer, reduce C-related impurities, increases thin film density, and suppress diffusion of Al and Zn to the interface between the gate insulating layer and the channel structure during high-temperature heat treatment to improve electrical characteristics and to secure excellent reliability.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims.

What is claimed is:

1. A semiconductor device, comprising a substrate, first conductive lines disposed on the substrate, spaced apart from each other in a first direction, and extending in a second direction, channel structures disposed on the first conductive lines, spaced apart from each other in the first and second directions, and extending in a third direction crossing the first and second directions, gate electrodes disposed between the channel structures and extending in a first direction, a gate insulating layer disposed between a channel structure of the channel structures and a gate electrode of the gate electrodes, and capacitor structures disposed on the channel structures, wherein the gate insulating layer has a ratio (%) of an Al—O peak observed at a binding energy of about 530.3 eV to about 531.6 eV to all peaks of greater than or equal to about 80% in an XPS spectrum of O 1s obtained by an X-ray photoelectron spectroscopy (XPS) using a monochromatic aluminum Kα (1486.6 eV) source.

2. The semiconductor device of claim 1, wherein the gate insulating layer has a ratio (%) of an OH/CO peak observed at a binding energy of about 531.7 eV to about 532.8 eV to all peaks of less than or equal to about 20% in the XPS spectrum of O 1s.

3. The semiconductor device of claim 1, wherein the channel structure has a ratio (%) of an Oder peak observed at a binding energy of about 529.8 eV to about 530.7 eV to all peaks of less than or equal to about 15% in an XPS spectrum of O 1s obtained by an X-ray photoelectron spectroscopy using a monochromatic aluminum Kα (1486.6 eV) source.

4. The semiconductor device of claim 3, wherein the channel structure has a ratio (%) of an M-O peak observed at a binding energy of about 528.7 eV to about 529.7 eV to all peaks of greater than or equal to about 82% in the XPS spectrum of O 1s.

5. The semiconductor device of claim 3, wherein the channel structure has a ratio (%) of an M-OH peak observed at a binding energy of about 530.8 eV to about 531.8 eV to all peaks of less than or equal to about 3.2% in the XPS spectrum of O 1s.

6. The semiconductor device of claim 1, wherein the gate insulating layer has a ratio of an average value of a C intensity to an average value of an Al intensity of less than or equal to about 0.5 in a SIMS spectrum obtained by dynamic secondary ion mass spectroscopy (D-SIMS) using a cesium ion ($Cs^+$) source (6 keV).

7. The semiconductor device of claim 6, wherein the gate insulating layer has a ratio of an average value of an H intensity to an average value of an Al intensity of less than or equal to about 0.2 in the SIMS spectrum.

8. The semiconductor device of claim 6, wherein the gate insulating layer has a ratio of an average value of CO intensity to an average value of an Al intensity of less than or equal to about 0.01 in the SIMS spectrum.

9. The semiconductor device of claim 1, wherein the gate insulating layer comprises $HfO_2$, HfSiO, HfSiON, HfTaO, HfTiO, HfZrO, $ZrO_2$, $Al_2O_3$, or a combination thereof, and wherein the channel structures comprise IGZO (indium gallium zinc oxide), IGSO (indium gallium silicon oxide), ITZO (indium tin zinc oxide), IGTO (indium gallium tin oxide), IZO (indium zinc oxide), ZnO (zinc oxide), ZTO (zinc tin oxide), ZnON (zinc oxynitride), ZZTO (zirconium zinc tin oxide), SnO (tin oxide), HIZO (hafnium indium zinc oxide), GZTO (gallium zinc tin oxide), AZTO (aluminium zinc tin oxide), YGZO (ytterbium gallium zinc oxide), IGO (indium gallium oxide), or a combination thereof.

10. The semiconductor device of claim 1, wherein a thin film density of the gate insulating layer is greater than or equal to about 3.0 $g/cm^3$.

11. A semiconductor device, comprising a substrate, first conductive lines disposed on the substrate, spaced apart from each other in a first direction, and extending in a second direction, channel structures disposed on the first conductive lines, spaced apart from each other in the first and second directions, and extending in a third direction crossing the first and second directions, gate electrodes disposed between the channel structures and extending in a first direction, a gate insulating layer disposed between a channel structure of the channel structures and a gate electrode of the gate electrodes, an interface layer disposed between the gate insulating layer and the channel structure and comprising aluminum (Al), zinc (Zn), gallium (Ga), indium (In), or a combination thereof, and capacitor structures disposed on the channel structures.

12. The semiconductor device of claim 11, wherein the semiconductor device has a ratio of a thickness of the interface layer to a sum of a thickness of the gate insulating layer and a thickness of the channel structure of less than or equal to about 40%.

13. The semiconductor device of claim 12, wherein during line scanning from the gate insulating layer to the channel structure using transmission electron microscope-energy dispersive X-ray analysis (TEM-EDX), wherein the sum of the thickness of the gate insulating layer and the thickness of the channel structure is a distance from a point where an Al intensity is 50% relative to a maximum Al intensity in a section where the Al intensity rapidly increases, to a point where a Zn intensity is 50% relative to a maximum Zn intensity in a section where the Zn intensity rapidly decreases, and wherein the thickness of the interface layer is a section having an Al intensity of about 10% to about 90% relative to the maximum Al intensity and a Zn intensity of about 10% to about 90% relative to the maximum Zn intensity at the same time.

14. The semiconductor device of claim 11, wherein the gate insulating layer comprises $HfO_2$, HfSiO, HfSiON, HfTaO, HfTiO, HfZrO, $ZrO_2$, $Al_2O_3$, or a combination thereof, and wherein the channel structures comprise IGZO (indium gallium zinc oxide), IGSO (indium gallium silicon oxide), ITZO (indium tin zinc oxide), IGTO (indium gallium tin oxide), IZO (indium zinc oxide), ZnO (zinc oxide), ZTO (zinc tin oxide), ZnON (zinc oxynitride), ZZTO (zirconium zinc tin oxide), SnO (tin oxide), HIZO (hafnium indium zinc oxide), GZTO (gallium zinc tin oxide), AZTO (aluminium zinc tin oxide), YGZO (ytterbium gallium zinc oxide), IGO (indium gallium oxide), or a combination thereof.

15. The semiconductor device of claim 11, wherein in an XPS spectrum of O 1s obtained by an X-ray photoelectron spectroscopy (XPS) using a monochromatic aluminum Kα (1486.6 eV) source, the gate insulating layer has:

a ratio (%) of an Al—O peak observed at a binding energy of about 530.3 eV to about 531.6 eV to all peaks of greater than or equal to about 80%, and a ratio (%) of an OH/CO peak observed at a binding energy of about 531.7 eV to about 532.8 eV to all peaks of less than or equal to about 20%.

16. The semiconductor device of claim 11, wherein in an XPS spectrum of O 1s obtained by an X-ray photoelectron spectroscopy using a monochromatic aluminum Kα (1486.6 eV) source, the channel structure has:

a ratio (%) of an $O_{def}$ peak observed at a binding energy of about 529.8 eV to about 530.7 eV to all peaks of less than or equal to about 15%, a ratio (%) of an M-O peak observed at a binding energy of about 528.7 eV to about 529.7 eV to all peaks of less than or equal to about 82%, and a ratio (%) of an M-OH peak observed at a binding energy of about 530.8 eV to about 531.8 eV to all peaks of less than or equal to about 3.2%.

17. The semiconductor device of claim 11, wherein in a SIMS spectrum obtained by dynamic secondary ion mass spectroscopy (D-SIMS) using a cesium ion ($Cs^+$) source (6 keV), the gate insulating layer has:

a ratio of an average value of a C intensity to an average value of an Al intensity of less than or equal to about 0.5, a ratio of an average value of an H intensity to an average value of an Al intensity of less than or equal to about 0.2, a ratio of an average value of CO intensity to an average value of an Al intensity of less than or equal to about 0.01.

* * * * *